United States Patent [19]

van der Meulen

[11] Patent Number: 5,359,289
[45] Date of Patent: Oct. 25, 1994

[54] MAGNETIC RESONANCE DEVICE

[75] Inventor: Peter van der Meulen, Eindhoven, Netherlands

[73] Assignee: U.S. Philips Corporation, New York, N.Y.

[21] Appl. No.: 981,739

[22] Filed: Nov. 25, 1992

[30] Foreign Application Priority Data

Nov. 29, 1991 [EP] European Pat. Off. ........ 91203131.7

[51] Int. Cl.$^5$ ............................................. G01R 33/40
[52] U.S. Cl. ..................................... 324/320; 324/318
[58] Field of Search .................. 324/20, 318, 322, 300, 324/319, 314; 128/653.5

[56] References Cited

U.S. PATENT DOCUMENTS

| | | | |
|---|---|---|---|
| 4,677,318 | 6/1987 | Sekihara et al. | 324/307 |
| 4,791,369 | 12/1988 | Yamamoto et al. | 324/312 |
| 4,899,109 | 2/1990 | Tropp | 324/320 |
| 4,987,371 | 1/1991 | Glover et al. | 324/320 |
| 5,099,207 | 3/1992 | Luyten | 324/309 |
| 5,168,232 | 12/1992 | Glover | 324/320 |

OTHER PUBLICATIONS

"Rapid Fully Automatic, Arbitrary Volume in Vivo Shimming" Webb et al, Mag. Res. in Medicine, vol. 20, No. 1, Jul. 1, 1991 pp. 113–122.

"A New Approach to Automatic Shimming" Prammer et al, Journal of Magnetic Resonance, vol. 77, No. 1, Mar. 1988, pp. 40–52.

"Principe de cartographie d'un cham magnetique par une methode d'imagerie fondee sur la sequence d'echos stimules" Briguet et al, Comptes Rendus de l'Academie des Sciences vol. 306, No. 15, Apr. 21, 1988.

Primary Examiner—Kenneth A. Wieder
Assistant Examiner—Raymond Y. Mah
Attorney, Agent, or Firm—Jack D. Slobod

[57] ABSTRACT

In known magnetic resonance devices shimming is applied on the basis of maps of field inhomogeneities obtained from two images of a slice of an object by formation of a ratio image thereof. This ratio image is processed in order to obtain shimming information. These known methods are time-consuming and cumbersome. The invention proposes a fast and simple shimming method which utilizes only one measuring sequence or a few measuring sequences. The shimming gradient (−dG) is determined from a time shift between an anticipated temporal position (t1) and a measured temporal position (t1') of a maximum of an echo resonance signal (ec) produced by the measuring sequence.

8 Claims, 3 Drawing Sheets

MAGNETIC RESONANCE DEVICE

BACKGROUND OF THE INVENTION

1. Field of the Invention

The invention relates to a magnetic resonance device, comprising a main field magnet for generating a steady magnetic field in a measurement space for accommodating an object, a coil system for generating a gradient magnetic field, an RF coil system for generating RF electromagnetic pulses, and sampling means for sampling magnetic resonance signals generated in the object, which device furthermore comprises control means and also shimming means for shimming the steady magnetic field.

2. Description of the Related Art

A magnetic resonance device of this kind is known from U.S. Pat. No. 4,987,371. That US Patent describes a shimming method which is based on an inhomogeneity map of the main field which is determined from phase measurements of each voxel in the object. First two images of a slice of the object are determined by memos of a so-called spin echo or a so-called spin-warp measuring sequence, the timing of the echo resonance signal for the different images being chosen so as to be different. Subsequently, a ratio image is determined from said two images and finally, after multiplication of the ratio image by a weighting function, shimming gradients are determined by way of curve fitting. This enables linear and higher-order shimming. This shimming method is cumbersome and time-consuming.

SUMMARY OF THE INVENTION

It is an object of the invention to provide a magnetic resonance device offering fast and simple shimming.

To achieve this, a magnetic resonance device in accordance with the invention is characterized in that the shimming means comprise programmed means which successively activate the control means so that, by application of at least one excitation pulse and at least one gradient magnetic field, an echo resonance signal is generated in the object, the sampling means taking signal samples of the echo resonance signal, the shimming means comprising further means for determining a shimming gradient on the basis of an anticipated position of the echo resonance signal and a position of the echo resonance signal as determined from the signal samples. Thus, very fast shimming is achieved which can be applied in any sub-volume to be selected. The shimming gradient determined can be used directly and automatically during a measurement performed on the object subsequent to the shimming, such as an imaging or spectroscopic imaging measurement. Because of its speed, shimming in accordance with the invention is not susceptible to motion. The means for determining the shimming gradient may be realized by a programmable device, such as a computer, or otherwise.

The invention is based on the idea that in many cases only the linear shims need readjustment, i.e. the gradient magnetic field coil system, without higher-order shimming being required, in first instance it being assumed that deviations between the theoretical and the actual timing of the applied gradients and the delay in the high-frequency receiver are negligibly small.

An embodiment of a magnetic resonance device in accordance with the invention in which the timing of the gradients is not known a priori is characterized in that by application of the inverted gradient magnetic field, there is generated a further echo resonance signal, the shimming gradient being determined inter alia on the basis of the position of the further echo resonance signal. Fast shimming which requires only two measurements is also achieved in this embodiment. For this version it is assumed that the timing of the gradients does not change when the gradient is inverted.

Another embodiment of a magnetic resonance device in accordance with the invention is characterized in that a further echo resonance signal is generated at another position to be anticipated, the shimming gradient being determined inter alia on the basis of the anticipated position and the determined position of the further echo resonance signal. This version, being based on the assumption that the timing error in the position of the echo resonance signal does not change when the echo resonance signal is shifted, again includes only two measurements.

A further embodiment of a magnetic resonance device in accordance with the invention is characterized in that, in dependence on the number of applied pulses, a sub-volume to be shimmed is restricted in one, two or three directions by making the pulses selective. When one field echo is used, the sub-volume to be shimmed is restricted in one direction by making the excitation pulse slice selective. When a spin-echo sequence comprising one or two echo resonance signals is used, the sub-volume to be shimmed can be restricted in two or three directions. When a stimulated echo resonance signal is used, restriction in three directions can be achieved by making the respective pulses selective.

A further restriction of the sub-volume can be achieved by bandpass filtering or by applying saturation prior to the excitation pulses.

Another embodiment of a magnetic resonance device in accordance with the invention is characterized in that one excitation pulse is applied, followed by gradient magnetic fields, in order to generate field echos in two or three different directions. It is thus achieved that two or three different shimming gradients are determined by one measurement.

BRIEF DESCRIPTION OF THE DRAWING

The invention will be described in detail hereinafter with reference to the drawing; therein.

DETAILED DESCRIPTION OF THE PREFERRED EMBODIMENTS

Figure 1:
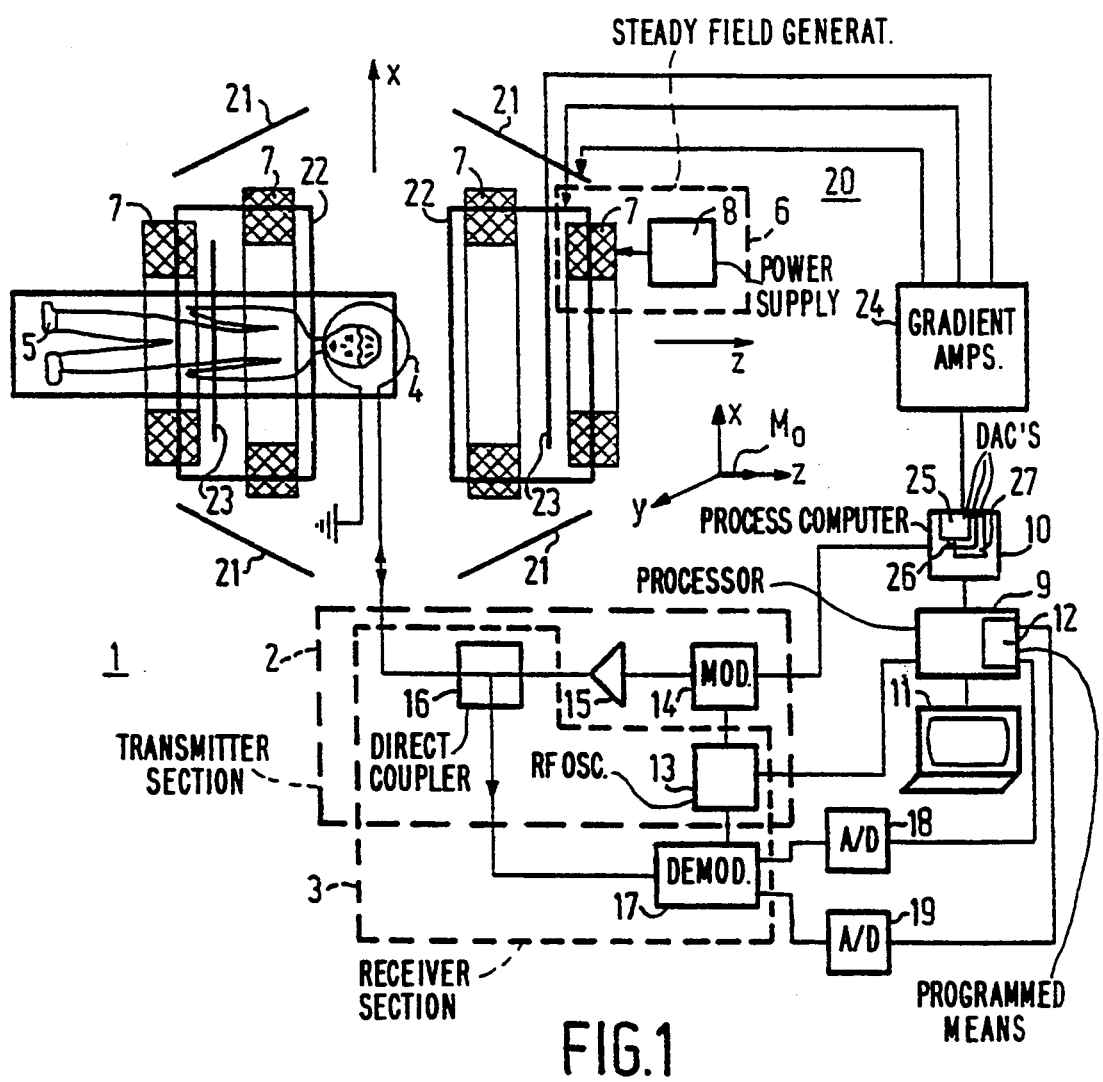
FIG. 1 shows diagrammatically a magnetic resonance device in accordance with the invention.

FIG. 1 shows diagrammatically a magnetic resonance device 1 in accordance with the invention, comprising a transmitter section 2 and a receiver section 3 for transmitting RF electromagnetic pulses, via a transmitter/receiver coil 4, to an object 5 and for receiving magnetic resonance signals, respectively, which are generated by the RF electromagnetic pulses in the object 5 which is arranged in a steady, uniform magnetic field. The transmitter/receiver coil 4 may be a single coil but may alternatively be formed by a separate transmitter coil and a separate receiver coil. The device 1 comprises means 6 for generating the steady field. The means 6 comprise magnet coils 7 and, in the event of resistive magnets or superconducting magnets, a DC power supply 8. In the event of a permanent magnet, the DC power supply 8 is absent. During operation of the device 1 with the object 5 arranged within the magnet coils 7 in a measurement space, a slight excess of nuclear spins (of nuclei having a magnetic moment) will be directed in the direction of the steady field in the state of equilibrium. From a macroscopic point of view this is to be considered as an equilibrium magnetization $M_o$. The device 1 furthermore comprises a processor 9 which is coupled to the transmitter section 2 and the receiver section 3, a process computer 10 which is coupled to the process or section 9 and the transmitter means, and display device 11 for displaying a nuclear magnetization distribution which is determined, using programmed means 12 within processing, from the resonance signals received by the receiver section 3, after their demodulation and signal sampling (detection of resonance signals). More specifically, the transmitter section 2 comprises an RF oscillator 13 for generating a carrier signal, a modulator 14 for amplitude and/or phase and frequency modulation of the carrier signal, a power amplifier 15 and a directional coupler 16 which is coupled to the transmitter/receiver coil 4. The RF oscillator 13 is coupled to the process or 9 and the modulator 14 is coupled to the process computer 10. When excitation pulses having a frequency content around the so-called Larmor frequency of, for example protons axe applied to the object 5, under the control of the programmed means 12 and via the transmitter section 2, magnetic resonance signals will be generated wherefrom a proton nuclear spin distribution or a magnetic resonance image can be determined by the programmed means 12 using, for example Fourier transformation. The receiver means 3 for receiving the resonance signals comprise the directional coupler 16 and a receiving and demodulation unit 17. The unit 17 may be a double phase-sensitive detector, the output signals of which axe sampled by means of a first analog-to-digital converter 18 and a second analog-to-digital converter 19. The A/D converters 18 and 19 are coupled to the process section 9. The transmitter and receiver means 2 and 3 may alternatively be formed by a so-called phase coherent digital transmitter/receiver. The device 1 furthermore comprises gradient coil system 20 for generating magnetic field gradients which are superposed on the steady, uniform field. The section 20 comprises gradient magnet coils 21, 22 and 23 for generating magnetic field gradients $G_x$, $G_y$ and $G_z$, respectively, and a power supply system which can be controlled by the process computer 10 and which comprises gradient amplifiers 24 for powering the gradient magnet coils 21, 22 and 23 which can be separately activated. The process computer 10 comprises digital-to-analog converters (DACs) 25, 26 and 27 for applying, by the supply of digital codes and under the control of the process computer 10, analog gradient waveforms to the gradient power supply system 24 whereby the respective gradients $G_x$, $G_y$ and $G_z$ are generated. For example, in the event of 2D-FT, $G_x$ is a measuring or read gradient, $G_y$ is a phase encoding gradient, and $G_z$ is a slice selection gradient. In the case of 3D-FT, $G_z$ may be a further phase encoding gradient. Generally speaking, the gradients generated by the gradient coils need not correspond to the functional measuring, phase encoding or slice selection gradients. Via combinations of gradients, slices can be measured in arbitrary directions. In the embodiment shown, the arrangement in space of the gradient magnet coils is such that the field direction of the magnetic field gradients coincides with the direction of the steady, uniform magnetic field, the gradient directions extending perpendicularly to one another as indicated by three mutually perpendicular axes x, y and z in FIG. 1. The magnetic resonance signals wherefrom a nuclear spin distribution can be reconstructed by means of Fourier transformation are obtained by means of so-called measuring sequences.

Figure 2:
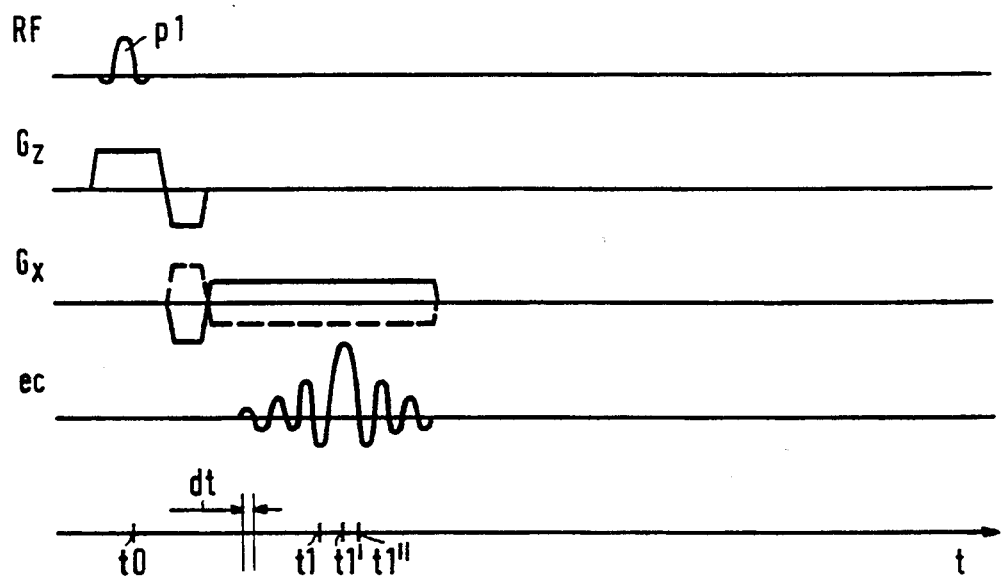
FIGS. 2, 3, 4 and 5 show measuring sequences for shimming the magnetic resonance device in accordance with the invention.

FIG. 2 shows a measuring sequence as a function of time t for shimming a magnetic resonance device I in accordance with the invention. The measuring sequence comprises an RF electromagnetic excitation pulse p1 which is applied to the object 5, using the transmitter/receiver coil 4, at the instant $t=t0$. To this end, the programmed means activate the process computer 10. The measuring sequence also comprises a gradient $G_x$ for shimming a sub-volume of the object 5, which gradient is applied, after the excitation pulse p1, by activation of the gradient amplifier 24 associated with this gradient and comprising the digital-to-analog converter 25. This results in an echo resonance signal ec which, after reception and demodulation in the receiving and detection device 17, is subjected to two-channel sampling by means of the analog-to-digital converters 18 and 19 with a sampling interval dt. Phase-sensitive detection thus takes place. The programmed means 12 determines the position of the echo resonance signal and more specifically the appearance of the echo maximum at the instant $t=t1'$. This echo maximum at $t=t1'$ occurs due to local field inhomogeneities, at an instant which has been shifted relative to an anticipated position of the echo resonance signal with an anticipated maximum at the instant $t=t1$. In accordance with the invention, the programmed means 12 determine a shimming gradient $-dG$ in the direction of the gradient G to be shimmed in conformity with:

$$dG = G \cdot \frac{t1 - t1'}{t1'}$$

The linear shimming gradient $-dG$, compensating for a linear inhomogeneity in the direction of the gradient, is superposed, in measuring sequences to be applied after shimming, on the gradient G to be applied therein. This embodiment is based on the assumption that deviations between theoretical and actual timing of the applied gradients and delay time of the receiver unit are negligibly small because of a previously performed adjustment of the system. If the timing of the gradients is not known a priori, a second measurement can be performed by a polarity reversal of the gradient G. This is denoted by a dashed line in FIG. 2. The programmed means then determine the echo maximum of a further echo resonance signal at the instant $t=t''$. The shimming gradient $-dG$ is then determined by:

$$dG = G \cdot \frac{t1'' - t1'}{t1'' + t1'}$$

i.e. independent of the anticipated time t1.

Moreover, if the error at the anticipated instant of the echo resonance signal ec does not change when the echo is shifted, a second measurement can be executed with a shifted echo. An echo ec' in the second measurement (not shown) is shifted by a differently sized gradient G', the anticipated maximum of echo ec' occurs at an anticipated instant $t=t2$ and the actual maximum of which occurs at an instant $t=t2'$. In that case the shimming gradient $-dG$ is determined by:

$$dG = G \cdot \frac{t1 - t1' - t2 + t2'}{t1' - t2'}$$

The described shimming method can be analogously used for other gradient directions. The volume to be shimmed can be restricted in one direction by making the excitation pulse selective, for example by application of a selection gradient $G_z$. The volume to be shimmed can be restricted in other directions by application of saturation pulses, for example selective 90° pulses, prior to the excitation pulse p1. The volume to be shimmed can also be restricted in the direction of the gradient to be shimmed by analog or digital bandpass filtering of the echo resonance signal. Digital filtering can be performed by first Fourier transforming the signal, followed by digital filtering out of a desired part of the spectrum obtained, and subsequently by inverse Fourier transforming the digitally filtered signal to a time signal. The instant $t=t1'$ is then determined from the digitally filtered signal. Volume restriction can thus be performed in many ways in dependence on the desired application. For example, for measurement of a set of slices in a sub-volume of the object 5, a volume of $10\times25\times25$ cm$^3$ can be measured, during measurement of a single slice a volume of $0.5\times25\times25$ cm$^3$ can be measured, and in the case of spectroscopy $3\times3\times3$ cm$^3$ can be measured. The measurements can be performed without separate shim coils. The shimming gradient G can be determined not only by means of the programmed means 12, but also by way of other means. For example, the time differences determined can be iteratively reduced to zero by manual manipulation of the shimming gradient G. The time differences can then be displayed on the display device 11.

Figure 3:
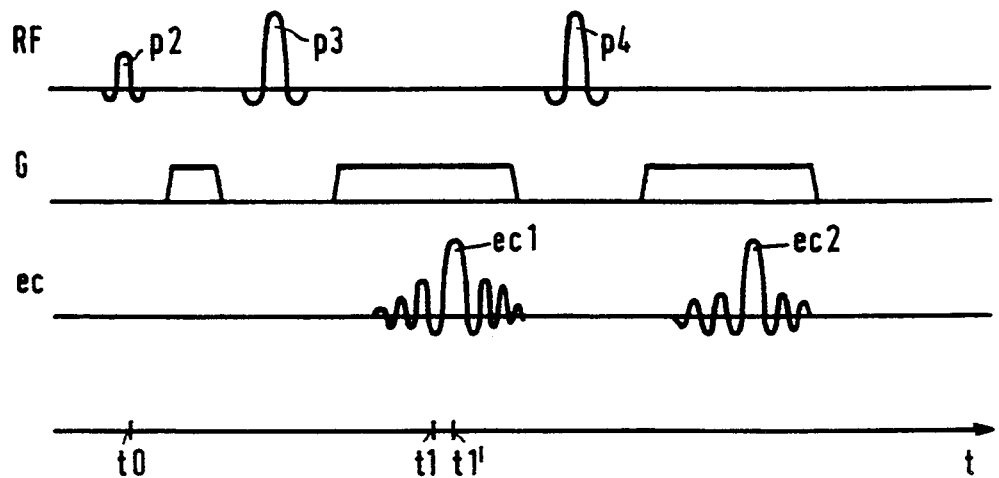

FIG. 3 shows another measuring sequence for shimming in accordance with the invention, which sequence is based on spin echos. After application of an excitation pulse p2 at the instant $t=t0$, an echo resonance signal ec1 is obtained by further application of a gradient G for shimming a sub-volume of the object 5, and by application of an inversion pulse p3, the echo maximum of said echo resonance signal at the instant $t=t1'$ having been shifted, due to local field inhomogeneities, relative to the theoretical maximum at the instant $t=t1$. Another echo resonance signal ec2 can be obtained by application of a further inversion pulse p4. In the same way as described with reference to FIG. 2, the programmed means 12 can determine a shimming gradient $-dG$ therefrom. The volume to be shimmed can be restricted in two or three directions by making the pulses p2 and p3 or p2, p3 and p4, respectively, slice selective. Like in the embodiment described with reference to FIG. 2, bandpass filtering and/or application of saturation pulses prior to excitation can again be used.

Figure 4:
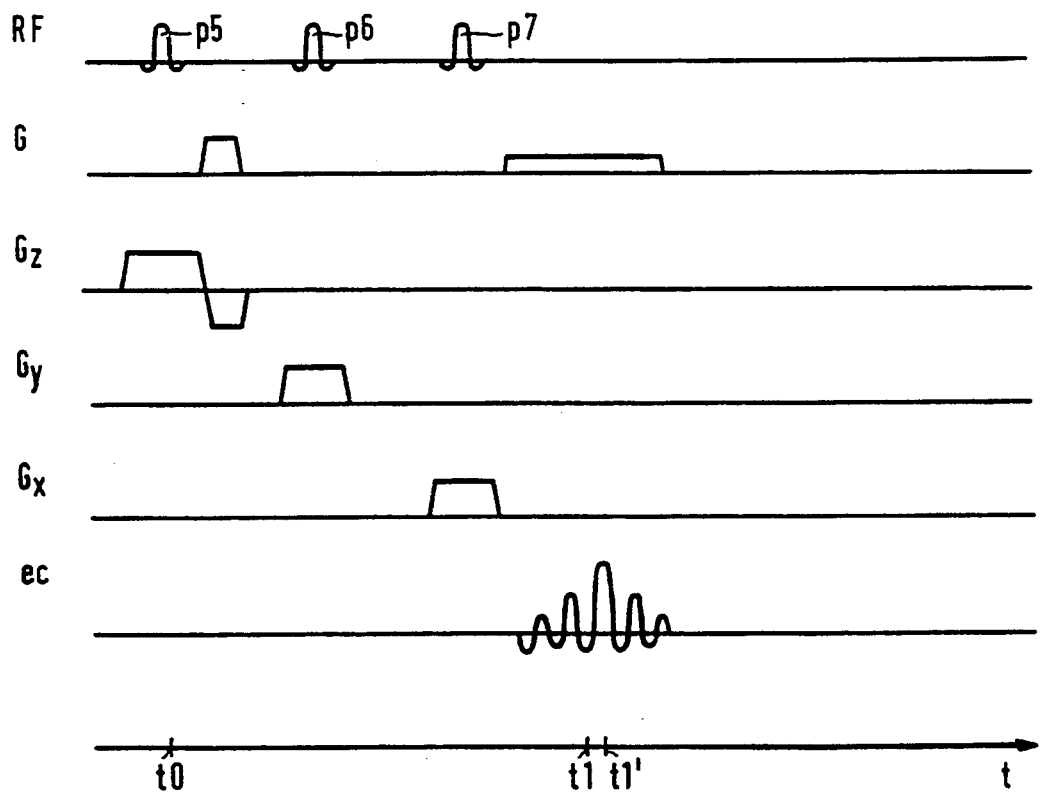

FIG. 4 shows a further embodiment of a measuring sequence for shimming in accordance with the invention. Pulses p5, p6 and p7 are applied and a gradient G is applied between the pulses p5 and p6 and also after the pulse p7 in order to obtain an echo resonance signal ec. The echo maximum occurs at the instant $t=t1'$, shifted in time relative to the instant $t=t1$ of the theoretically anticipated maximum. The shimming gradient $-dG$ is formed in the same way as described with reference to FIG. 2. The volume to be shimmed can be restricted in three directions, denoted by the gradients $G_x$, $G_y$ and $G_z$ in FIG. 4. Bandpass filtering and/or presaturation can again be applied.

Figure 5:
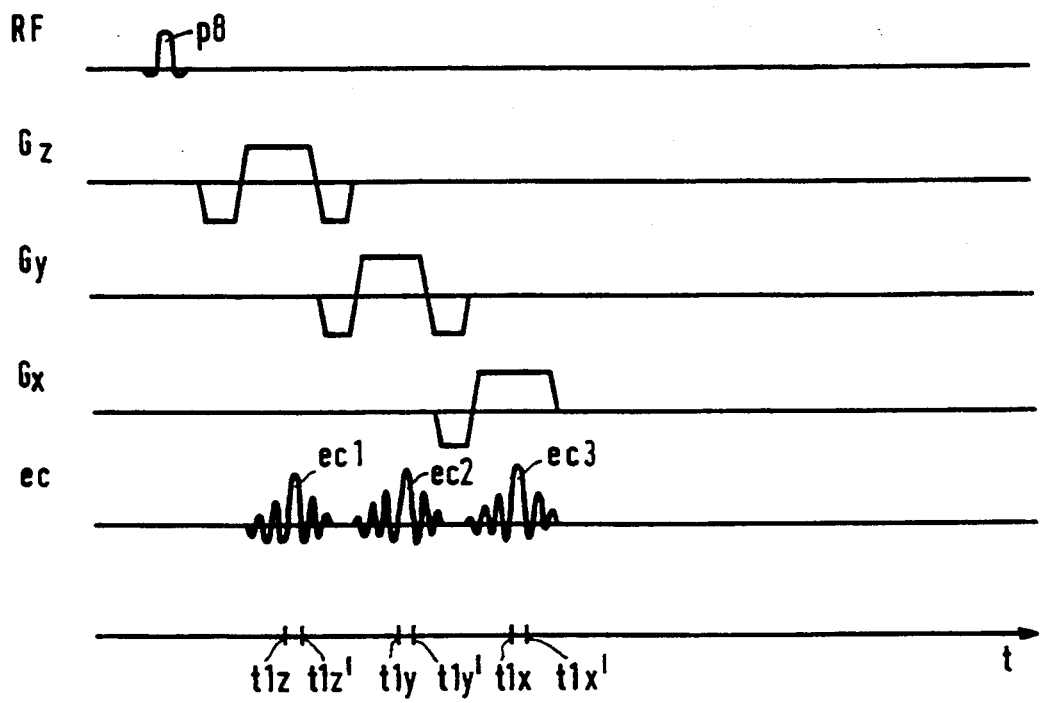

FIG. 5 shows a version of a measuring sequence for shimming in accordance with the invention whereby shimming gradients for three directions can be determined during one measurement. There are applied successively an excitation pulse and three compensated gradients $G_z$, $G_y$ and $G_x$, so that at the respective instants $t=t1z'$, $t=ty1'$ and $t=tx1'$ there are obtained echo signals which have been shifted relative to theoretical maxima at $t=t1z$, $t=t1y$ and $t=t1x$, respectively. The determination of the shimming gradients $-dGz$, $-dGy$ and $-dGx$ can be performed in a similar way as described with reference to FIG. 2. This is a version comprising a field gradient. A similar measurement can be executed by means of stimulated echos or by means of spin echos.

I claim:

1. A magnetic resonance device, comprising a measurement space for accommodating an object to be examined, a main field magnet for generating a steady magnetic field in the measurement space, a gradient coil system for generating a gradient magnetic field in the measurement space having a gradient in any desired direction, an RF coil system for transmitting RF electromagnetic pulses into the measurement space and for receiving magnetic resonance signals generated in the object, means for detecting and sampling the received magnetic resonance signals, control means for controlling the RF and gradient coil systems to produce sequences of RF pulses and gradient waveforms, shimming means for shimming the steady magnetic field with a shimming gradient, and shimming gradient determination means for configuring the control means to control the gradient coil system and the RF coil system to produce a shimming gradient determination sequence including one or more RF excitation pulses and one or more measuring gradient waveforms during which echo magnetic resonance signals are generated in the object, which echo magnetic resonance signals are detected and sampled by the detecting and sampling means, and for determining a shimming gradient on the basis of the temporal position within the sequence of a maximum of the detected and sampled echo magnetic resonance signals.

2. A magnetic resonance device as claimed in claim 1, wherein said temporal position of the maximum of the detected and sampled echo magnetic resonance signals is with respect to an anticipated temporal position of said maximum.

3. A magnetic resonance device as claimed in claim 1, wherein said one or more measuring gradient waveforms comprise a first measuring gradient waveform during which a first echo magnetic resonance signal is generated, and a second measuring gradient waveform, which is inverted in polarity relative to the first measuring gradient waveform, during which a second echo magnetic resonance signal is generated, said first and second echo magnetic resonance signals being detected and sampled, and wherein said shimming gradient determination means comprises means for determining a shimming gradient on the basis of the temporal positions within the sequence of the maxima of the detected and sampled first and second echo magnetic resonance signals.

4. A magnetic resonance device as claimed in claim 2, wherein two echo magnetic resonance signals are generated in said shimming gradient determination sequence and wherein said shimming gradient determination means comprises means for determining a shimming gradient on the basis of the temporal positions within the sequence of the maxima of the detected and sampled first and second echo magnetic resonance signals with respect to anticipated temporal positions of said first and second echo magnetic resonance signals.

5. A magnetic resonance device as claimed in claim 1, wherein the one or more RF excitation pulses are two or three selective RF excitation pulses for restricting, to two or three dimensions, a sub-volume to be shimmed.

6. A magnetic resonance device as claimed in claim 1, wherein the shimming gradient determination means includes means for applying bandpass filtering so as to restrict a sub-volume to be shimmed.

7. A magnetic resonance device as claimed in claim 1, wherein the shimming gradient measuring sequence includes at least one RE saturation pulse prior to the one or more RF excitation pulses in order to restrict a sub-volume to be shimmed.

8. A magnetic resonance device as claimed in claim 1, wherein the shimming gradient measuring sequence includes at least two successive measuring gradient waveforms having gradients in mutually orthogonal directions in order to generate respective echo magnetic resonance signals during said read gradient waveforms, and wherein components of said shimming gradient in said mutually orthogonal directions are determined on the basis of the temporal positions within the sequence of the maxima of echo magnetic resonance signals.

* * * * *